(12) United States Patent
Monroe

(10) Patent No.: US 10,121,766 B2
(45) Date of Patent: Nov. 6, 2018

(54) PACKAGE-ON-PACKAGE SEMICONDUCTOR DEVICE ASSEMBLIES INCLUDING ONE OR MORE WINDOWS AND RELATED METHODS AND PACKAGES

(71) Applicant: Micron Technology, Inc., Boise, ID (US)

(72) Inventor: Matthew Monroe, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/238,382

(22) Filed: Aug. 16, 2016

(65) Prior Publication Data

US 2018/0005983 A1 Jan. 4, 2018

Related U.S. Application Data

(60) Provisional application No. 62/356,929, filed on Jun. 30, 2016.

(51) Int. Cl.
*H01L 23/02* (2006.01)
*H01L 25/065* (2006.01)
(Continued)

(52) U.S. Cl.
CPC ...... *H01L 25/0652* (2013.01); *H01L 23/3675* (2013.01); *H01L 23/49816* (2013.01);
(Continued)

(58) Field of Classification Search
CPC . H01L 25/0652; H01L 25/50; H01L 23/3675; H01L 23/48816; H01L 25/16;
(Continued)

(56) References Cited

U.S. PATENT DOCUMENTS 6,150,724 A * 11/2000 Wenzel ............... H01L 25/0657
257/724
6,710,434 B1 3/2004 Bai
(Continued)

OTHER PUBLICATIONS

International Search Report from International Application No. PCT/US2017/038486, dated Sep. 29, 2017, 5 pages.
(Continued)

*Primary Examiner* — Kevin M Picardat
(74) *Attorney, Agent, or Firm* — TraskBritt

(57) ABSTRACT

Semiconductor device packages for incorporation into semiconductor device assemblies may include a substrate including an array of electrically conductive elements located on a lower surface of the substrate. A window may extend through the substrate from the lower surface to an upper surface of the substrate. The array of electrically conductive elements may at least partially laterally surround a periphery of the window, and the substrate may extend laterally beyond the array of electrically conductive elements. Semiconductor devices may be supported on the upper surface of the substrate around a periphery of the array of electrically conductive elements. The semiconductor devices may be electrically connected to at least some of the electrically conductive elements of the array by routing elements extending from the semiconductor devices toward the window.

20 Claims, 5 Drawing Sheets

(51) Int. Cl.
  *H01L 23/367* (2006.01)
  *H01L 23/498* (2006.01)
  *H01L 25/00* (2006.01)
  *H01L 23/40* (2006.01)

(52) U.S. Cl.
  CPC ...... *H01L 25/50* (2013.01); *H01L 2023/4062* (2013.01); *H01L 2225/0652* (2013.01); *H01L 2225/06589* (2013.01)

(58) Field of Classification Search
  CPC ........... H01L 23/49816; H01L 23/3672; H01L 25/065–25/0657; H01L 25/071; H01L 25/112; H01L 23/36–23/3738; H01L 23/4012; H01L 25/115; H01L 23/538–23/5389
  USPC .......................... 438/108, 109; 257/680, 686
  See application file for complete search history.

(56) References Cited

U.S. PATENT DOCUMENTS

| | | | |
|---|---|---|---|
| 6,734,535 B1 | 5/2004 | Hashimoto | |
| 6,906,415 B2 * | 6/2005 | Jiang | H01L 23/13 257/668 |
| 7,268,002 B2 * | 9/2007 | Koide | H05K 1/141 257/E21.503 |
| 7,408,254 B1 | 8/2008 | Kim et al. | |
| 7,687,899 B1 | 3/2010 | Berry | |
| 7,911,046 B2 * | 3/2011 | Cablao | H01L 25/0652 257/686 |
| 8,254,155 B1 * | 8/2012 | Crisp | H01L 25/0652 257/686 |
| 8,823,144 B2 | 9/2014 | Khan et al. | |
| 2002/0149098 A1 | 10/2002 | Seyama et al. | |
| 2005/0062152 A1 | 3/2005 | Tsai | |
| 2006/0087009 A1 * | 4/2006 | Yang | H01L 23/13 257/675 |
| 2006/0197209 A1 * | 9/2006 | Choi | H01L 24/83 257/686 |
| 2006/0231938 A1 | 10/2006 | Mangrum | |
| 2008/0157327 A1 | 7/2008 | Yang | |
| 2008/0237833 A1 * | 10/2008 | Hsu | H01L 21/568 257/691 |
| 2008/0258293 A1 | 10/2008 | Yang et al. | |
| 2009/0134510 A1 * | 5/2009 | Kim | H01L 25/105 257/698 |
| 2011/0024888 A1 * | 2/2011 | Pagaila | H01L 23/13 257/686 |
| 2012/0075807 A1 * | 3/2012 | Refai-Ahmed | H01L 23/13 361/719 |
| 2012/0241925 A1 | 9/2012 | Yoon et al. | |
| 2012/0267797 A1 * | 10/2012 | Haba | H01L 23/3128 257/777 |
| 2013/0021769 A1 * | 1/2013 | Fukuzono | H01L 23/13 361/783 |
| 2013/0119549 A1 | 5/2013 | Cheng et al. | |
| 2013/0256914 A1 | 10/2013 | Cheng et al. | |
| 2014/0021605 A1 | 1/2014 | Yu et al. | |
| 2014/0264811 A1 | 9/2014 | Wu | |
| 2014/0264946 A1 | 9/2014 | Kim et al. | |
| 2014/0291830 A1 | 10/2014 | Hwang | |
| 2015/0061095 A1 | 3/2015 | Choi et al. | |
| 2016/0071818 A1 * | 3/2016 | Wang | H01L 25/0655 257/774 |

OTHER PUBLICATIONS

International Written Opinion from International Application No. PCT/US2017/038486, dated Sep. 29, 2017, 7 pages.
Taiwanese Office Action and Search Report from Taiwanese Application No. 106121938, dated Aug. 13, 2018, 12 pages with English translation.

* cited by examiner

PACKAGE-ON-PACKAGE SEMICONDUCTOR DEVICE ASSEMBLIES INCLUDING ONE OR MORE WINDOWS AND RELATED METHODS AND PACKAGES

CROSS-REFERENCE TO RELATED APPLICATION

This application claims the benefit of U.S. Provisional Patent Application Ser. No. 62/356,929, filed Jun. 30, 2016, the disclosure of which is hereby incorporated herein in its entirety by this reference.

FIELD

This disclosure relates generally to semiconductor device assemblies employing package-on-package (POP) configurations. More specifically, disclosed embodiments relate to semiconductor device assemblies employing windowed POP configurations and related methods and packages.

BACKGROUND

When operatively connecting individual semiconductor devices to one another, a package-on-package (POP) configuration may be employed. POP configurations may be assembled by placing a first substrate having a first semiconductor device thereon over the top of a second substrate having a second semiconductor device thereon and electrically and mechanically securing the first substrate to the second substrate. Some such POP configurations may employ a windowed substrate. For example, U.S. Patent App. Pub. No. 2014/0264946, published Sep. 18, 2014, to Kim et al., the disclosure of which is incorporated herein in its entirety by this reference, discloses a windowed POP configuration wherein the first semiconductor device is located within a window extending through the second substrate, and the second semiconductor device is stacked on top of the first semiconductor device and electrically connected to the second substrate by wire bonds.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

Figure 1:
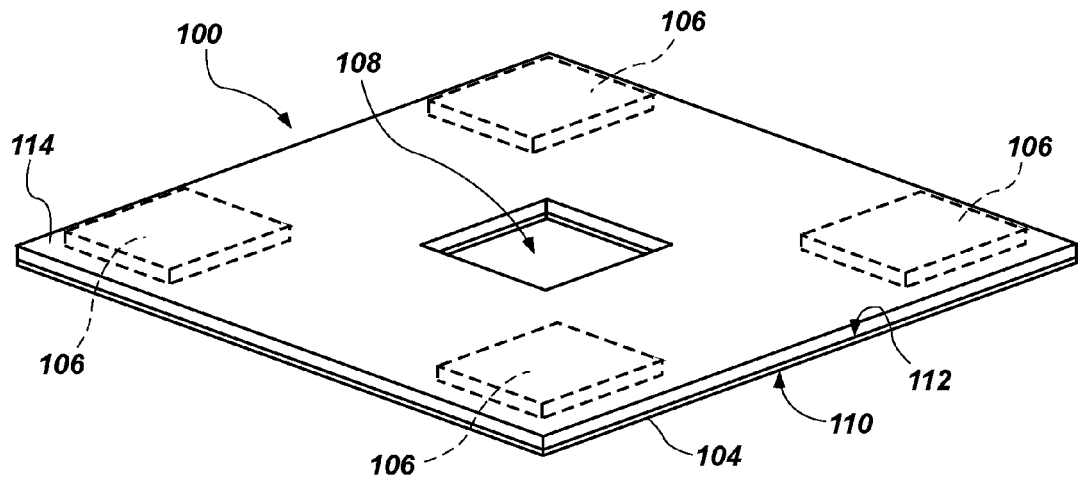
FIG. 1 is a top perspective view of a semiconductor device package for incorporation into a semiconductor device assembly.

The illustrations presented in this disclosure are not meant to be actual views of any particular semiconductor device assembly, semiconductor device package, or component thereof, but are merely idealized representations employed to describe illustrative embodiments. Thus, the drawings are not necessarily to scale.

Disclosed embodiments relate generally to semiconductor device assemblies employing windowed POP configurations that may reduce assembly height, enable easier routing among connected components, and better utilize available surface area. More specifically, disclosed are embodiments of semiconductor device assemblies that may position a first semiconductor device proximate a window (e.g., at, adjacent to, at least partially received through the window) in an overlying substrate (e.g., abutting a portion of the overlying substrate defining the window) and may distribute other semiconductor devices around a periphery of the window.

As used in this disclosure, the terms "upper," "lower," "overlying," and other terms denoting a relative orientation are used merely for convenience, and refer only to the orientation depicted in the drawings. When semiconductor device assemblies and components thereof within the scope of this disclosure are deployed for actual use, they may be oriented in any direction convenient and useful for the user. For example, surfaces referred to in this disclosure as being "upper" may, in fact, be oriented downward, to the side, at an angle, or moved among the various orientations when incorporated into a final product and deployed for use.

Referring to FIG. 1, a top perspective view of a semiconductor device package 100 for incorporation into a semiconductor device assembly 102 (see FIG. 3) is shown. The semiconductor device package 100 may include, for example, a substrate 104 bearing semiconductor devices 106 thereon. The substrate 104 may include, for example, a board, plank, or wafer of dielectric or semiconductor material. More specifically, the substrate 104 may include, for example, a printed circuit board or a semiconductor wafer.

A window 108 may extend through the substrate 104 from a lower surface 110 thereof to an upper surface 112 thereof. The window 108 may be, for example, a hole, opening, void, port, or other aperture providing airflow communication between the lower and upper surfaces 110 and 112 of the substrate 104. A periphery of the window 108 may be of the same shape as a shape of a periphery of the substrate 104 in some embodiments, such as that shown in FIG. 1. For example, the peripheries of the window 108 and the substrate 104 may both be rectangular (e.g., square) in shape. In other embodiments, the periphery of the window 108 may be of a different shape from the shape of the periphery of the substrate 104, as shown in FIG. 10. A geometric center of the window 108 may be at least substantially aligned with a geometric center of the substrate 104 in some embodiments. For example, a point of greatest average distance to the lateral periphery of the window 108 may be located in at least substantially the same location as a point of greatest average distance to the lateral periphery of the substrate 104. In other embodiments, the geometric center of the window 108 may be misaligned from the geometric center of the substrate 104. The window 108 may be laterally surrounded by material of the substrate 104 in some embodiments. For example, the window 108 may be enclosed by, and the periphery of the window 108 may be defined by, a contiguous surface of the substrate 104 extending around the window 108. In other embodiments, the window 108 may be only partially laterally surrounded by the material of the substrate 104, such as, for example, on three sides or two sides. Although a single window 108 is depicted in FIG. 1, substrates 104 including multiple windows 108 may be employed.

The semiconductor devices 106 may be supported and/or integrated on the upper surface 112 of the substrate 104, and may be distributed proximate a periphery of the window 108. The semiconductor devices 106 may be located between the periphery of the substrate 104 and the periphery of the window 108 on any number of its sides. For example, the semiconductor devices 106 may be laterally adjacent to the window 108 proximate each corner thereof, as shown in FIG. 1, on each side thereof, on three sides or corners thereof, on two opposite sides or corners thereof, on one side or corner thereof, or on any combination of sides and corners.

Figure 3:
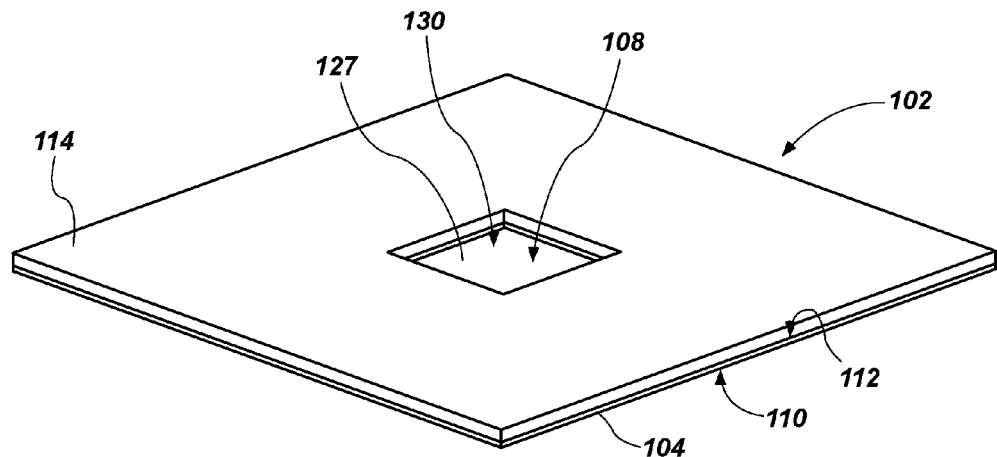
FIG. 3 is a top perspective view of a semiconductor device assembly including the semiconductor device package of FIG. 1.
Figure 4:
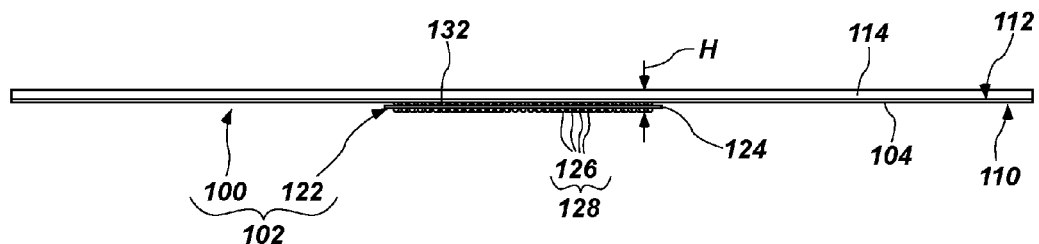
FIG. 4 is a side view of the semiconductor device assembly of FIG. 3.

The semiconductor devices 106 may include, for example, functional components to be operatively connected to another semiconductor device package 122 (see FIG. 4) to form a semiconductor device assembly (see FIGS. 3, 4). More specifically, the semiconductor devices 106 may include, for example, singulated chips (e.g., rectangular prisms) of semiconductor material (e.g., silicon, germanium, gallium) having integrated circuitry thereon to perform a predetermined function. As a specific, nonlimiting example, the semiconductor devices 106 may include memory chips (e.g., dynamic random access memory (DRAM), static random access memory (SRAM), read-only memory (ROM), programmable read-only memory (PROM), erasable programmable read-only memory (EPROM), electrically erasable programmable read-only memory (EEPROM), flash memory). In some embodiments, one or more of the semiconductor devices 106 represented in FIG. 1 may include a stack of individual semiconductor devices.

In some embodiments, such as that shown in FIG. 1, an overmold 114 may be positioned on at least a portion of the upper surface 112 of the substrate 104 at least partially around at least some of the semiconductor devices 106. For example, the overmold 114 may completely cover the upper surface 112 of the substrate 104 and completely laterally surround the semiconductor devices 106. More specifically, the overmold 114 may completely cover the upper surface 112 of the substrate 104 and completely cover the semiconductor devices 112 supported thereon. The overmold 114 may include, for example, a polymer material (e.g., an epoxy). In other embodiments, the semiconductor device package 100 may lack any overmold 114, leaving at least a portion of the upper surface 112 of the substrate 104 and the semiconductor devices 106 exposed to the environment.

Figure 2:
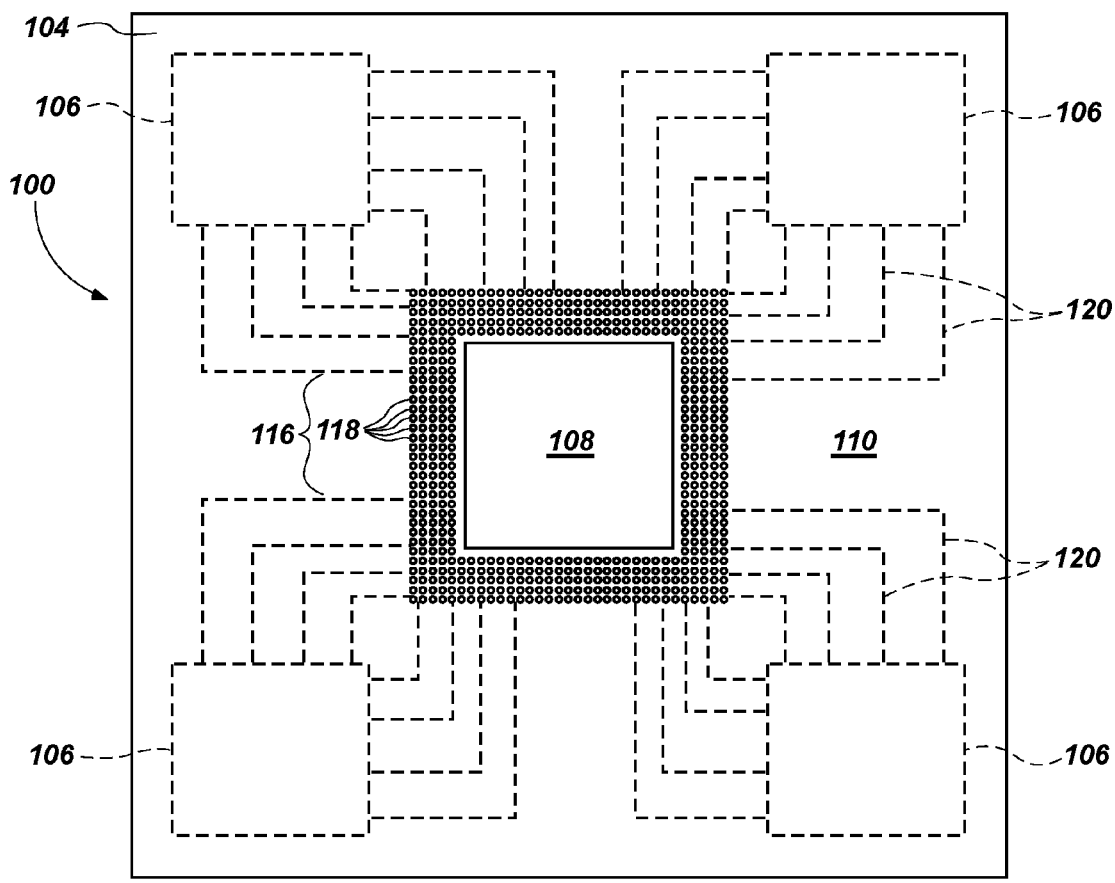
FIG. 2 is a bottom view of the semiconductor device package of FIG. 1.

FIG. 2 is a bottom view of the semiconductor device package 100 of FIG. 1. The semiconductor device package 100 may include an array 116 of electrically conductive elements 118 located on the lower surface 110. The electrically conductive elements 118 may include, for example, pads, bumps, balls, pillars, or other structures of electrically conductive material (e.g., copper, gold, metal alloys) exposed at the lower surface 110 of the substrate 104. The array 116 may be located adjacent to the periphery of the window 108. For example, the array 116 may extend around at least a portion of a periphery of the window 108. More specifically, the array 116 may completely surround the window 108 and be positioned directly laterally adjacent to the periphery of the window 108, such that the array 116 is spaced laterally from the semiconductor devices 106 on the upper surface 112 (see FIG. 1) and from a periphery of the substrate 104. The semiconductor devices 106 may be located laterally between the periphery of the array 116 and the periphery of the substrate 104.

Routing elements 120 may operatively connect the semiconductor devices 106 to at least some electrically conductive elements 118 of the array 116 of electrically conductive elements 118. The routing elements 120 may include, for example, lines, traces, or pathways of electrically conductive material electrically connecting the semiconductor devices 106 to respective electrically conductive elements 118 of the array 116. The routing elements 120 may extend along the upper surface 112 (see FIG. 1), lower surface 110, or within the material of the substrate 104 from the semiconductor devices 106 toward the window 108 to the respective electrically conductive elements 118 of the array 116.

As a specific, nonlimiting example, semiconductor device packages for incorporation into semiconductor device assemblies in accordance with this disclosure may include a substrate including an array of electrically conductive elements located on a lower surface of the substrate. A window may extend through the substrate from the lower surface to an upper surface of the substrate. The array of electrically conductive elements may at least partially laterally surround a periphery of the window, and the substrate may extend laterally beyond the array of electrically conductive elements. Semiconductor devices may be supported on the upper surface of the substrate around a periphery of the array of electrically conductive elements. The semiconductor devices may be electrically connected to at least some of the electrically conductive elements of the array by routing elements extending from the semiconductor devices toward the window.

FIG. 3 is a top perspective view of a semiconductor device assembly 102 including the semiconductor device package 100 of FIG. 1, and FIG. 4 is a side view of the semiconductor device assembly 102 of FIG. 3. Referring jointly to FIGS. 3 and 4, the semiconductor device package 100 may be assembled with another semiconductor device package 122 in a package-on-package (POP) configuration to form the semiconductor device assembly 102. The other semiconductor device package 122, which may be a first of the semiconductor device packages 100 and 122 when viewed from bottom to top, may include, for example, a first substrate 124 and a first semiconductor device 127 borne by the first substrate 124.

The first substrate 124 of the first semiconductor device package 122 may underlie the second substrate 104 of the second semiconductor device package 100. The first substrate 124 may include, for example, a board, plank, or wafer of dielectric or semiconductor material. More specifically, the first substrate 124 may include, for example, a printed circuit board or a semiconductor wafer. The first substrate 124 may include an array 126 of electrically conductive elements 128 located on an upper surface 130 of the first substrate 124, the upper surface 130 facing the lower surface 110 of the second substrate 104. The electrically conductive elements 128 may include, for example, pads, bumps, balls, pillars, paste, or other structures of electrically conductive material exposed at the upper surface 130 of the first substrate 124.

At least some electrically conductive elements 128 of the array 126 may be electrically connected to corresponding electrically conductive elements 118 of the array 116. For example, the electrically conductive elements 128 of the array 126 and corresponding electrically conductive elements 118 of the array 116 may be secured to one another (e.g., by a soldered connection) to operatively connect the first semiconductor device 127 to one or more of the additional semiconductor devices 106 (see FIGS. 1, 2) and to mechanically secure the first semiconductor device package 122 to the second semiconductor device package 100. In such embodiments, a portion of the second substrate 104 (e.g., the portion defining the periphery of the window 108) and a portion of the first substrate 124 may overlap such that the electrically conductive elements 128 of the array 126 may be electrically connected to corresponding electrically conductive elements 118 of the array 118. For example, the portion of the second substrate 104 defining the periphery of the window 108 and the window 108 itself may collectively overlie at least a majority (e.g., an entirety) of the first substrate 124.

A surface area of the upper surface 130 of the first substrate 124 may be less than a surface area of the lower surface 110 of the second substrate 104. For example, the surface area of the lower surface 110 of the second substrate 104 may be at least about 1.1 times the surface area of the upper surface 130 of the first substrate 124. More specifically, the surface area of the lower surface 110 of the second substrate 104 may be, for example, at least about 1.5 times the surface area of the upper surface 130 of the first substrate 124. As specific, nonlimiting examples, the surface area of the lower surface 110 of the second substrate 104 may be at least about 2, 2.5, or 3 times the surface area of the upper surface 130 of the first substrate 124. The second substrate 104 may extend laterally beyond the periphery of the first substrate 124 on at least one side. For example, the second substrate 104 may protrude laterally from the first substrate 124 on two sides, three sides, or all four sides. There may be more available surface area for the routing elements 120 (see FIG. 2) because the second substrate 104 is larger than the first substrate 124, enabling greater numbers of connections to be made without requiring a reduction in size of the routing elements 120 (see FIG. 2), reducing cross talk between routing elements 120 (see FIG. 2), and enabling greater numbers of additional semiconductor devices 106 (see FIGS. 1, 2) to be deployed.

The first semiconductor device 127 may include, for example, functional components to be operatively connected to one or more of the additional semiconductor devices 106 of the second semiconductor device package 100. More specifically, the first semiconductor device 127 may include, for example, a singulated chip of semiconductor material having integrated circuitry thereon to perform a predetermined function. As a specific, nonlimiting example, the semiconductor device 127 may include a processing unit (e.g., logic circuit, processor, microprocessor). Although a single first semiconductor device 127 is depicted in FIG. 3, the first semiconductor device package 122 may include multiple semiconductor devices 127 in other embodiments.

The first semiconductor device 127 extend from below the lower surface 110 of the second substrate 104 of the second semiconductor device package 100 at least partially through the window 108. For example, the first semiconductor device 127 and window 108 may be of a size, shape, and positioning enabling the first semiconductor device 127 to extend from proximate the upper surface 130 of the first substrate 124, into and at least partially through the window 108, such that an upper surface 132 of the first semiconductor device 127 may be located within the window 108 between the upper and lower surfaces 112 and 110 of the second substrate 104, as shown in FIG. 3. As another example, the first semiconductor device 127 may extend from proximate the upper surface 130 of the first substrate 124, completely through the window 108, such that an upper surface 132 of the first semiconductor device 127 is coplanar with, or is located above, the upper surface 112 of the second substrate 104. More specifically, the first semiconductor device 127 may extend from proximate the upper surface 130 of the first substrate 124, completely through the window 108, such that the upper surface 132 of the first semiconductor device 127 protrudes from the overmold 114. The height H of the semiconductor device assembly 102 may be reduced because the second substrate 104 may be closer to the first substrate 124 than it would if there were no window 108 to receive the first semiconductor device 127 or a portion thereof, which would require a larger gap, which may also be characterized as a standoff, between the first and second semiconductor substrates 124 and 104. In embodiments where the first semiconductor device package 122 includes multiple first semiconductor devices 127, the second substrate 104 may include multiple corresponding windows 108 for insertion of at least some of the first semiconductor devices at least partially therein, including, and up to, each of the first semiconductor devices 127.

As a specific, nonlimiting example, semiconductor device assemblies in accordance with this disclosure may include a first substrate comprising a first semiconductor device on the first substrate and a first array of electrically conductive elements located on an upper surface of the first substrate. A second substrate may overlie the first substrate, the second substrate including a second array of electrically conductive elements located on a lower surface of the second substrate. At least some of the electrically conductive elements of the second array electrically may be connected to corresponding electrically conductive elements of the first array. The second substrate may include a window extending through the second substrate from the lower surface to an upper surface of the second substrate. The second substrate may be configured to support additional semiconductor devices around a periphery of the window, at least a portion of an outer periphery of the first substrate being coupled to an inner portion of the second substrate defining the periphery of the window.

As another specific, nonlimiting example, methods of making semiconductor device assemblies in accordance with this disclosure may involve positioning a processing unit supported on an upper surface of a first substrate at least partially through a window in a second substrate overlying the first substrate. At least some electrically conductive elements of a first array of electrically conductive elements located on the upper surface of the first substrate may be electrically connected with at least some corresponding electrically conductive elements of a second array of electrically conductive elements located on the lower surface of the second substrate.

Figure 5:
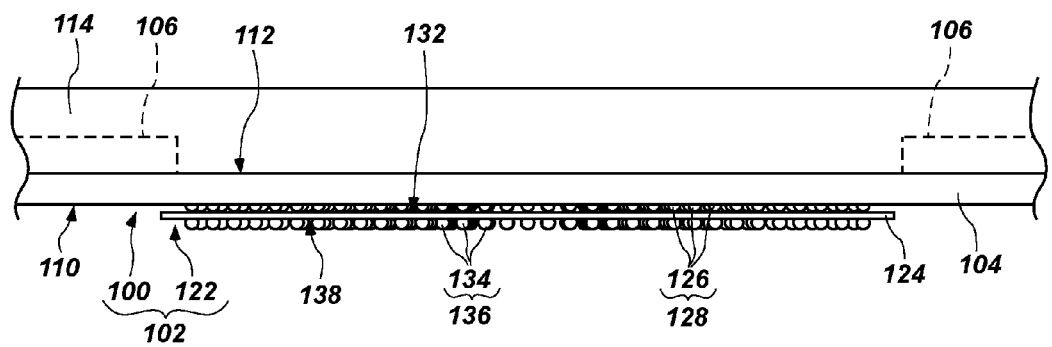
FIG. 5 is an enlarged portion of the side view of the semiconductor device assembly shown in FIG. 4.

FIG. 5 is an enlarged portion of the side view of the semiconductor device assembly 102 shown in FIG. 4. The first semiconductor device package 122 may include an array 134 of electrically conductive elements 136 located on a lower surface 138 of the first substrate 124, the lower surface 138 being located on a side of the first substrate 124 opposite the upper surface 130. The electrically conductive elements 136 may include, for example, pads, bumps, balls, pillars, or other structures of electrically conductive material exposed at the lower surface 138 of the first substrate 124. At least some electrically conductive elements 136 of the array 134 may be electrically connected to corresponding electrically conductive elements 128 of the array 126. For example, the electrically conductive elements 136 of the array 134 and corresponding electrically conductive elements 128 of the array 126 may be operatively connected to one another (e.g., by routing elements, vias) to operatively connect the semiconductor device assembly 102 and the various semiconductor devices 106 and 127 (see FIG. 3) thereof to another device or structure comprising, for example, higher-level packaging (e.g., a motherboard).

Figure 6:
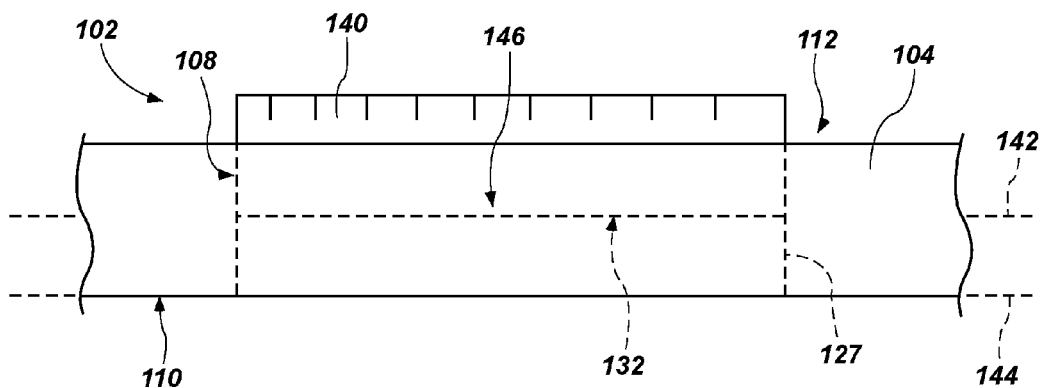
FIG. 6 is an enlarged portion of the side view of the semiconductor device assembly shown in FIG. 4 including a heat-management structure.

FIG. 6 is an enlarged portion of the side view of the semiconductor device assembly 102 shown in FIG. 4. In FIG. 6, the portion of the second substrate 104 including the window 108 and a portion of the first semiconductor device 127 extending partially therethrough are particularly shown. In addition, the overmold 114 has been omitted for clarity. In some embodiments, such as that shown in FIG. 6, a plane 142 coplanar with the upper surface 130 of the first semiconductor device 127 may intersect with the second substrate 104. Another plane 144 coplanar with the lower surface 110 of the second substrate 104 may intersect with the first semiconductor device 127.

In some embodiments, such as that shown in FIG. 6, a heat-management structure 140 may be supported on the upper surface 130 of the first semiconductor device 127. The heat-management structure 140 may include, for example, a heat sink, heat fin, heat pipe, heat spreader, Peltier cooler, forced air cooler, fluid cooler, or other structure for conducting heat away from the first semiconductor device 127. The heat-management structure 140 may be in direct contact with the upper surface 130, or may include an optional thermal interface material 146 (e.g., thermal paste) interposed between the heat-management structure 140 and the upper surface 130. The heat-management structure 140 may be positioned closer to the first semiconductor device 127 because the window 108 may grant more direct access to the first semiconductor device 127, improving heat transfer away from the first semiconductor device 127.

Figure 7:
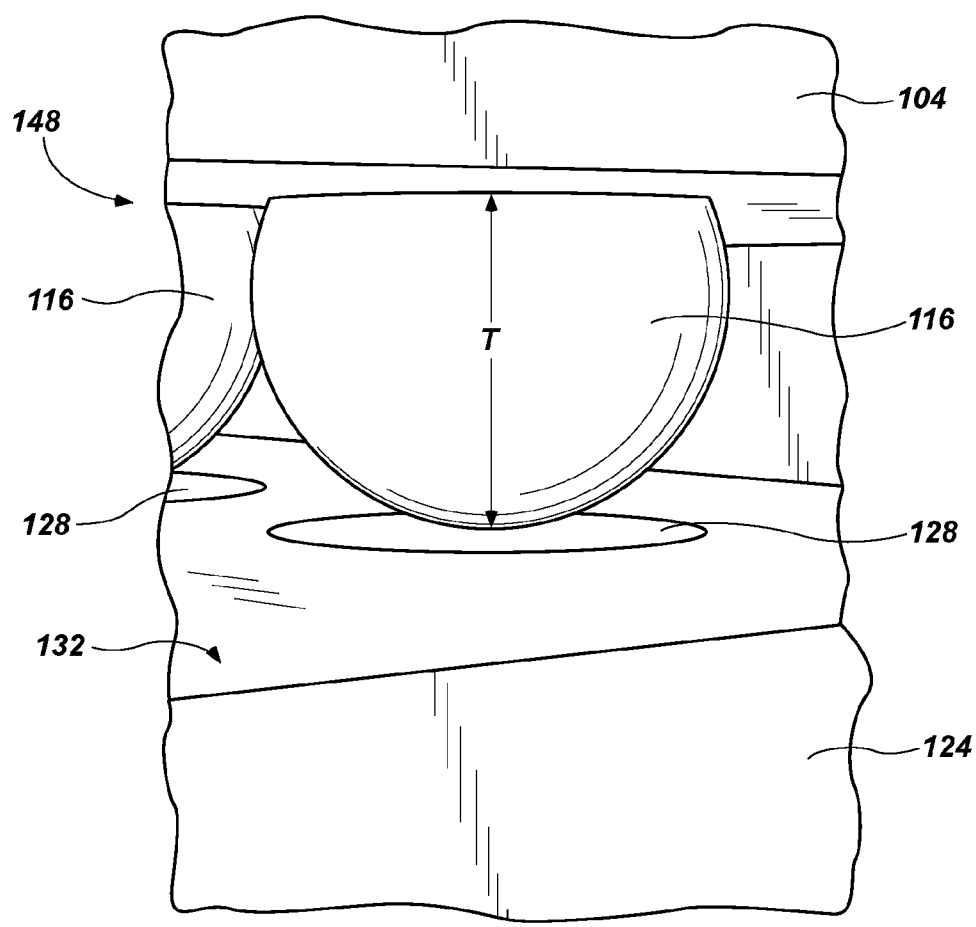
FIG. 7 is a further enlarged perspective view of an electrical connection of the semiconductor device assembly of FIG. 4.

FIG. 7 is a further enlarged perspective view of an electrical connection 148 of the semiconductor device assembly 102 of FIG. 4. A thickness T of the electrical connection 148, including the electrically conductive elements 118 and 128 of the arrays 116 and 126 (see FIG. 5), may be less than a thickness of the first semiconductor device 127 (see FIG. 6). For example, the thickness T of the electrical connection 148 may be less than about 75% of the thickness of the first semiconductor device 127 (see FIG. 6). More specifically, the thickness T of the electrical connection 148 may be, for example, less than about 50% of the thickness of the first semiconductor device 127 (see FIG. 6). As a specific, nonlimiting example, the thickness T of the electrical connection 148 may be less than about 25% of the thickness of the first semiconductor device 127 (see FIG. 6). The reduced thickness T of the electrical connection 148 enabled by the at least partial insertion of the first semiconductor device 127 (see FIG. 6) into the window 108 (see FIG. 6), as opposed to utilizing a taller electrical connection to provide sufficient space to receive the first semiconductor device between the first and second substrates, may reduce the total height H (see FIG. 4) of the semiconductor device assembly 102 (see FIG. 4). As a specific, nonlimiting example, the electrically conductive elements 116 and 126 of the arrays 116 and 126 may include, respectively, balls of electrically conductive material extending from the second substrate 104 directly to corresponding pads of electrically conductive material at least substantially coplanar with the upper surface 132 of the first substrate 124.

Figure 8:
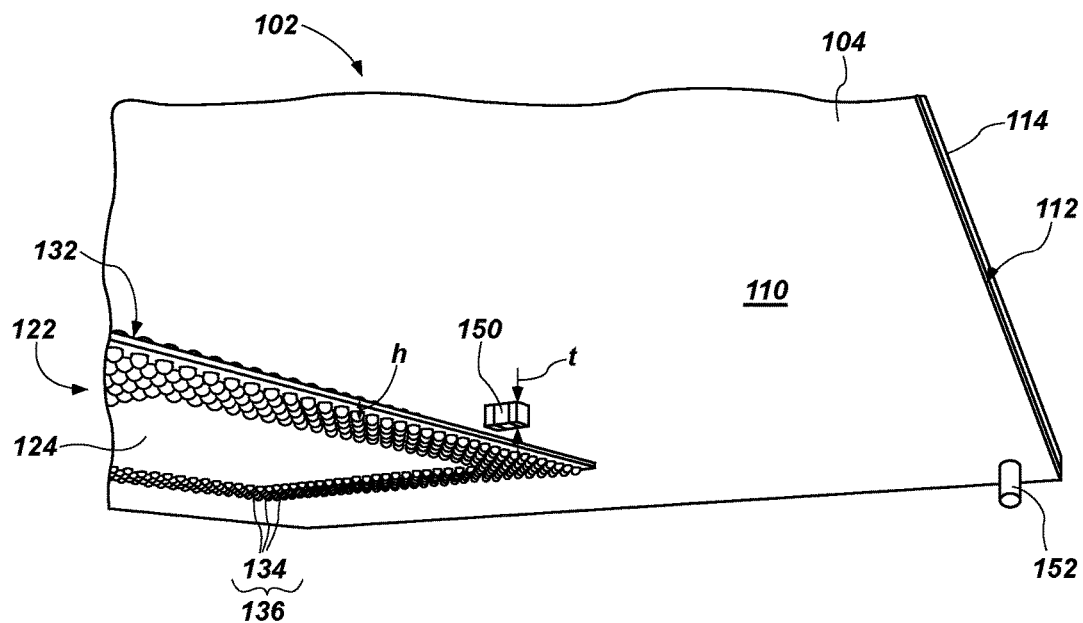
FIG. 8 is a bottom perspective view of a portion of the semiconductor device assembly of FIG. 4.

FIG. 8 is a bottom perspective view of a portion of the semiconductor device assembly 102 of FIG. 4. In some embodiments, the periphery of the first substrate 124 may be at least substantially of the same shape as the periphery of the second substrate 104, though exhibiting a different size. For example, each of the first and second substrates 124 and 104 may be rectangular (e.g., square) in shape in such embodiments.

In addition to providing greater surface area to accommodate routing elements 120, the surface area of the second substrate 104 may enable the operative connection of one or more electrical components 150 to the upper surface 112, the lower surface 110, or both. For example, at least one electrical component 150 may be operatively connected to a portion of the lower surface 110 of the second substrate 104 located laterally beyond the periphery of the first substrate 124. More specifically, the electrical component or components 150 may be located on the underside of an overhanging portion of the second substrate 104. A thickness t of each electrical component 150 may be, for example, less than or equal to a height h of the first semiconductor device package 122, as measured from a bottommost portion of an electrically conductive element 136 of the array 134 to the upper surface 132 of the first substrate 124. More specifically, the thickness t of each electrical component 150 may be, for example, between about 10% and about 90% of the height h of the first semiconductor device package 122. As a specific, nonlimiting example, the thickness t of each electrical component 150 may be between about 40% and about 60% of the height h of the first semiconductor device package 122. In other embodiments, the thickness t of one or more electrical components 150 may be, for example, greater than the height h of the first semiconductor device package 122, and any underlying structures may include a recess or window to receive the electrical components 150 at least partially therein. The electrical components 150 may include, for example, resistors, capacitors, inductors, integrated circuits, diodes, transistors, batteries, antennas, switches, and other electrical components operably connectable to semiconductor devices. Providing additional surface area for electrical components 150 may grant greater flexibility in the design of semiconductor device assemblies 102, and may reduce total surface area of the final product because electrical components 150 that would otherwise be positioned on another device or structure, such as, for example, a motherboard, may instead be included on the underside of the substrate 104.

In some embodiments, one or more structural supports 152 may extend from below the first substrate 124 to the second substrate 104 distal from a geometric center of the second substrate 104. More specifically, one or more structural supports 152 may extend from below the first substrate 124 to the second substrate 104 proximate the periphery of the second substrate 104. The structural support or supports 152 may reduce strain on the periphery of the second substrate 104, which may otherwise be cantilevered from the first substrate 124. The structural support or supports 152 may include, for example, columns, pillars, pins, screws, bolts, or other members extending from an underlying structure (e.g., a motherboard) to the second substrate 104. In some embodiments, the structural support or supports 152 may be affixed to the second substrate 104. In other embodiments, the structural support or supports 152 may be in contact with, or proximate to, the lower surface 110 of the second substrate 104 without being affixed thereto.

Figure 9:
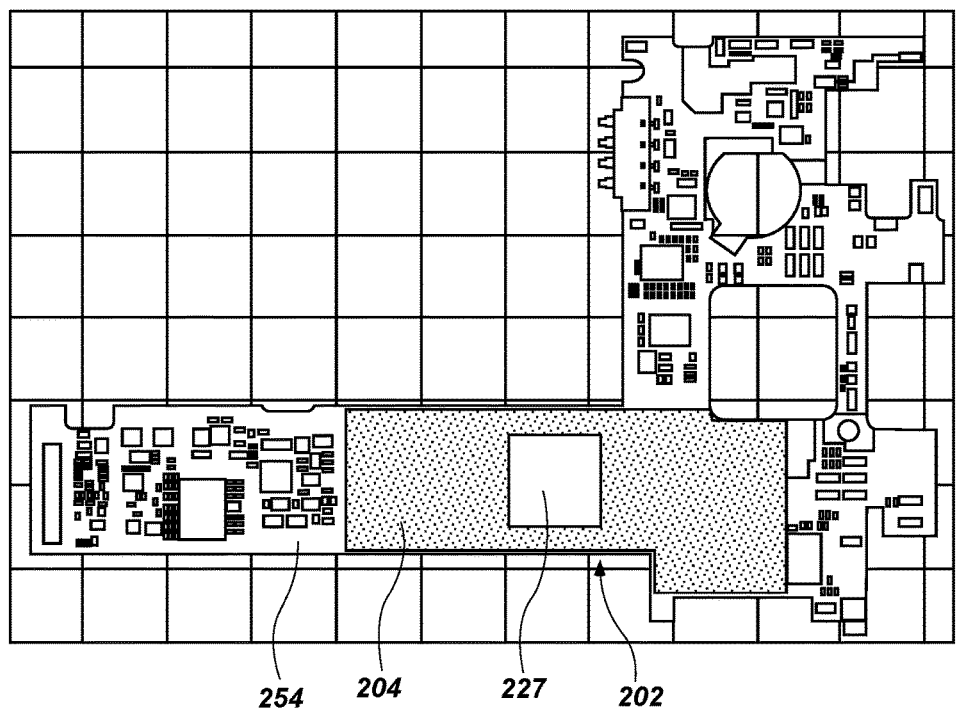
FIG. 9 is a top view of another embodiment of a semiconductor device assembly.

FIG. 9 is a top view of another embodiment of a semiconductor device assembly 202. When the semiconductor device assembly 202 has been completed, it may be operatively connected to an underlying device to form a final product. For example, the array 134 (see FIG. 8) may be electrically connected to a mating array on a motherboard 254 to affix the semiconductor device assembly 202 to the motherboard 254 and form a final product. The support structures 152 (see FIG. 8), if any, may extend from the motherboard 254 to the substrate 104.

In some embodiments, the shape of the periphery of a second substrate 204 (see FIG. 9) may differ from the shape of the periphery of the first substrate 124 (see FIG. 8). For example, the periphery of the first substrate 124 (see FIG. 8) may be rectangular, whereas the periphery of the second substrate 204 may be irregular, resembling a pair of intersecting rectangles. More specifically, the periphery of the second substrate 204 may extend at least substantially parallel to a corresponding periphery of the underlying motherboard 254.

While certain illustrative embodiments have been described in connection with the figures, those of ordinary skill in the art will recognize and appreciate that the scope of this disclosure is not limited to those embodiments explicitly shown and described in this disclosure. Rather, many additions, deletions, and modifications to the embodiments described in this disclosure may be made to produce embodiments within the scope of this disclosure, such as those specifically claimed, including legal equivalents. In addition, features from one disclosed embodiment may be combined with features of another disclosed embodiment while still being within the scope of this disclosure, as contemplated by the inventor.

What is claimed is:

1. A semiconductor device assembly, comprising:
    a first substrate comprising a first semiconductor device on the first substrate, a heat-management structure supported on an upper surface of the first semiconductor device, and a first array of electrically conductive elements located on an upper surface of the first substrate; and
    a second substrate overlying the first substrate, the second substrate comprising a second array of electrically conductive elements located on a lower surface of the second substrate, at least some of the electrically conductive elements of the second array electrically connected to corresponding electrically conductive elements of the first array, a thickness of the electrically conductive elements as measured in a direction at least substantially perpendicular to the lower surface of the second substrate being less than a thickness of the first substrate as measured in the direction;
    wherein the second substrate comprises a window extending from the lower surface to an upper surface of the second substrate, wherein at least a portion of the heat-management structure is located within the window, and wherein the second substrate is configured to support additional semiconductor devices around a periphery of the window, at least a portion of an outer periphery of the first substrate being coupled to an inner portion of the second substrate defining the periphery of the window.

2. The semiconductor device assembly of claim 1, wherein the first semiconductor device extends at least partially through the window, such that a plane coplanar with the lower surface of the second substrate intersects with the first semiconductor device.

3. The semiconductor device assembly of claim 2, wherein another plane coplanar with an upper surface of the first semiconductor device intersects with the second substrate.

4. The semiconductor device assembly of claim 1, wherein the heat-management structure protrudes from the second substrate.

5. The semiconductor device assembly of claim 1, wherein a surface area of the lower surface of the second substrate is greater than a surface area of the upper surface of the first substrate.

6. The semiconductor device assembly of claim 5, further comprising at least one electrical component supported on the lower surface of the second substrate laterally beyond a periphery of the first substrate, a thickness of the at least one electrical component being less than a height of the first substrate.

7. The semiconductor device assembly of claim 1, wherein the second array of electrically conductive elements is located laterally adjacent to the window and the semiconductor devices are configured to be supported on the upper surface of the second substrate located laterally adjacent to the array of electrically conductive elements on a side thereof opposite the window.

8. The semiconductor device assembly of claim 7, wherein the semiconductor devices are configured to be located proximate a periphery of the second substrate.

9. The semiconductor device assembly of claim 8, wherein the semiconductor devices are configured to be operatively connected to at least some of the electrically conductive elements of the second array by routing elements extending from the semiconductor devices proximate the periphery of the second substrate toward the window.

10. The semiconductor device assembly of claim 1, wherein the window is located proximate a geometric center of the second substrate.

11. The semiconductor device assembly of claim 1, wherein a periphery of the second substrate exhibits a same shape as a periphery of the first substrate.

12. The semiconductor device assembly of claim 1, wherein the window is laterally surrounded by material of the second substrate.

13. The semiconductor device assembly of claim 1, further comprising a structural support extending from below the first substrate to the second substrate distal from a geometric center of the second substrate.

14. The semiconductor device assembly of claim 1, wherein the electrically conductive elements of the first and second arrays comprise, respectively, balls of electrically conductive material extending from the second substrate directly to corresponding pads of electrically conductive material at least substantially coplanar with the upper surface of the first substrate.

15. An assembly of semiconductor device packages, comprising:
    a first semiconductor device package, comprising:
        a first substrate comprising a first array of electrically conductive elements located on an upper surface of the first substrate;
        a first semiconductor device on the upper surface of the first substrate; and
        a heat-management structure supported on an upper surface of the first semiconductor device; and
    a second semiconductor device package supported on the first semiconductor device package, comprising:
        a second substrate comprising a second array of electrically conductive elements located on a lower surface of the second substrate, a thickness of the electrically conductive elements as measured in a direction at least substantially perpendicular to the lower surface of the second substrate being less than a thickness of the first substrate as measured in the direction;

a window extending through the second substrate from the lower surface to an upper surface of the second substrate, the second array of electrically conductive elements at least partially laterally surrounding a periphery of the window, the second substrate extending laterally beyond the second array of electrically conductive elements; and additional semiconductor devices supported on the upper surface of the second substrate around a periphery of the array of electrically conductive elements, the additional semiconductor devices being electrically connected to at least some of the electrically conductive elements of the second array by routing elements extending from the additional semiconductor devices toward the window;

wherein at least a portion of the heat-management structure is located within the window, and wherein at least a portion of an outer periphery of the first substrate is coupled to an inner portion of the second substrate defining the periphery of the window.

16. A method of making a semiconductor device assembly, comprising:

positioning a processing unit supported on an upper surface of a first substrate at least partially through a window in a second substrate overlying the first substrate;

positioning a heat-management structure supported on an upper surface of the processing unit at least partially through the window; and electrically connecting at least some electrically conductive elements of a first array of electrically conductive elements located on the upper surface of the first substrate with at least some corresponding electrically conductive elements of a second array of electrically conductive elements located on a lower surface of the second substrate, a thickness of the first array of electrically conductive elements as measured in a direction least substantially perpendicular to the lower surface of the second substrate being less than a thickness of the first substrate as measured in the direction.

17. The method of claim 16, wherein positioning the processing unit at least partially through the window of the second substrate comprises positioning at least a portion of a surface area of the lower surface of the second substrate laterally beyond a periphery of the first substrate.

18. The method of claim 17, wherein positioning the processing unit at least partially through the window of the second substrate comprises positioning at least one electrical component supported on the lower surface of the second substrate laterally beyond the periphery of the first substrate.

19. The method of claim 16, further comprising supporting a portion of the second substrate distal from a geometric center of the second substrate on a structural support extending from below the first substrate.

20. The method of claim 16, wherein electrically connecting the at least some electrically conductive elements of the first array with the at least some corresponding electrically conductive elements of the second array comprises flowing balls of electrically conductive material extending from the second substrate directly to corresponding pads of electrically conductive material at least substantially coplanar with the upper surface of the first substrate to electrically connect the balls to the pads.

* * * * *